United States Patent
Kushida et al.

(10) Patent No.: US 7,398,439 B2
(45) Date of Patent: Jul. 8, 2008

(54) SEMICONDUCTOR DEVICE WITH MEMORY AND METHOD FOR MEMORY TEST

(75) Inventors: Keiichi Kushida, Yokohama (JP); Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 546 days.

(21) Appl. No.: 10/828,282

(22) Filed: Apr. 21, 2004

(65) Prior Publication Data

US 2005/0182997 A1    Aug. 18, 2005

(30) Foreign Application Priority Data

Feb. 13, 2004   (JP)   ............................. 2004-036077

(51) Int. Cl.
*G11C 29/00* (2006.01)
(52) U.S. Cl. .................. 714/718; 714/777; 714/764
(58) Field of Classification Search ................. 714/718, 714/766; 365/201
See application file for complete search history.

(56) References Cited

U.S. PATENT DOCUMENTS

| | | | | |
|---|---|---|---|---|
| 5,195,099 | A * | 3/1993 | Ueda et al. .................. | 714/718 |
| 6,295,617 | B1 | 9/2001 | Sonobe | |
| 6,988,237 | B1 * | 1/2006 | Solt et al. .................. | 714/763 |
| 2004/0008562 | A1 * | 1/2004 | Ito et al. ...................... | 365/223 |
| 2004/0184327 | A1 * | 9/2004 | Okuda ......................... | 365/199 |

FOREIGN PATENT DOCUMENTS

| | | | |
|---|---|---|---|
| JP | 08263391 A | * | 10/1996 |
| JP | 2001-23394 | | 1/2001 |
| JP | 2001-351398 | | 12/2001 |

OTHER PUBLICATIONS

P. Ramanathan, et al., IEEE VLSI Test Symposium, pp. 292-297, "Zero Cost Testing of Check Bits in RAMs With On-Chip ECC", Apr. 7-9, 1992.

Kiyohiro Furutani, et al., "A Built-in Hamming Code ECC Circuit for Dram's", IEEE Journal of Solid-State Circuits, vol. 24, No. 1, Feb. 1989, pp. 50-56.

* cited by examiner

*Primary Examiner*—Cynthia Britt
(74) *Attorney, Agent, or Firm*—Oblon, Spivak, McClelland, Maier & Neustadt, P.C.

(57) ABSTRACT

A semiconductor device is disclosed which includes a data memory which stores data and a code memory which stores an ECC code corresponding to the data. The semiconductor device includes an ECC unit which outputs, to the data memory as the data, a test pattern required to test the data memory, and which generates, from the test pattern, code information having an error checking function, and outputs the code information to the code memory as the ECC code.

10 Claims, 3 Drawing Sheets

Hamming martrix : H(n×m)=(8×5)

```
              1 2 3 4 5 6 7 8
            ┌ 0 1 0 1 1 0 1 1 ┐
            │ 1 0 0 1 0 1 0 1 │
            │ 1 0 1 0 1 0 1 0 │
            │ 1 1 1 0 1 1 0 1 │
            └ 0 1 1 1 0 1 1 0 ┘
```

|  | Data input : w | Code output : S |  |
|---|---|---|---|
| State 1 | 0 0 0 0 0 0 0 0 | 0 0 0 0 0 | ← ALL "0" |
| State 2 | 0 0 0 0 0 0 1 1 | 0 1 1 1 1 |  |
|  | 0 0 0 0 1 1 1 1 | 1 0 0 1 0 |  |
|  | 0 0 1 1 1 1 1 1 | 0 1 1 0 0 |  |
|  | 0 1 1 1 1 1 1 1 | 1 1 1 1 1 | ← ALL "1" |
|  | 0 1 1 1 1 1 0 0 | 1 0 0 0 0 |  |
|  | 0 1 1 1 0 0 0 0 | 0 1 1 0 1 |  |
|  | 0 1 0 0 0 0 0 0 | 1 0 0 1 1 |  |
|  | 0 0 0 0 0 0 0 0 | 0 0 0 0 0 |  |
| State 1 → | 0 1 0 1 0 1 0 1 | 1 1 0 1 1 |  |
| State 2 → | 0 1 0 1 0 1 1 0 | 1 0 1 0 0 |  |
|  | 0 1 0 1 1 0 1 0 | 0 1 0 0 1 |  |
|  | 0 1 1 0 1 0 1 0 | 1 0 1 1 1 |  |
|  | 1 0 1 0 1 0 1 0 | 0 1 0 1 0 |  |
|  | 1 0 1 0 1 0 0 1 | 0 0 1 0 1 |  |
|  | 1 0 1 0 0 1 0 1 | 1 1 0 0 0 |  |
|  | 1 0 0 1 0 1 0 1 | 0 0 1 1 0 |  |
|  | 0 1 0 1 0 1 0 1 | 1 1 0 1 1 |  |
|  | ↑50 | ↑51 |  |

SEMICONDUCTOR DEVICE WITH MEMORY AND METHOD FOR MEMORY TEST

CROSS-REFERENCE TO RELATED APPLICATIONS

This application is based upon and claims the benefit of priority from the prior Japanese Patent Application No. 2004-36077, filed Feb. 13, 2004, the entire contents of which are incorporated herein by reference.

BACKGROUND OF THE INVENTION

1. Field of the Invention

The present invention generally relates to a semiconductor device, and in particular, to a semiconductor device with memories and a method for memory tests which tests the memory.

2. Description of the Related Art

In general, semiconductor storage devices include a built-in ECC circuit type storage device. "ECC" stands for "error correcting code" in some cases. In the present specification, "ECC" is used to mean "error checking and correcting." Both a data memory for storing data and a code memory for storing ECC codes are incorporated in the built-in ECC circuit type semiconductor storage device (refer to, for example, U.S. Pat. No. 6,295,617).

For such a semiconductor storage device, a method for memory tests is available which tests the memories utilizing a built-in test circuit and the ECC circuit (refer to, for example, Japanese Patent No. 2001-351398).

With the method for memory tests described in this prior art document, when a memory read speed is tested, a 1-bit inversion circuit is used to invert a predetermined bit in write data and in an ECC code. Then, the data containing the error bits is written in memory cells. Test conditions are set so that during a read, the ECC circuit checks and corrects the errors in the data.

With the conventional method for memory tests, both the data memory and the code memory must be tested. Thus, compared to tests on a single memory which are executed only on the data memory of the same capacity, the conventional method requires a longer time for the test process. Furthermore, test circuits are required which deal with the data memory and code memory, respectively. This increases test costs.

BRIEF SUMMARY OF THE INVENTION

A semiconductor device according to an embodiment of the present invention comprises a data memory which stores data; a code memory which stores an error checking and correcting code corresponding to the data; and an error checking and correcting unit (ECC unit) which outputs, to the data memory as the data, a test pattern required to test the data memory, and which generates, from the test pattern, code information having an error checking function, and outputs the code information to the code memory as the error checking and correcting code.

DETAILED DESCRIPTION OF THE INVENTION

An embodiment of the present invention will be described below with reference to the drawings.

Configuration of Semiconductor Device

Figure 1:
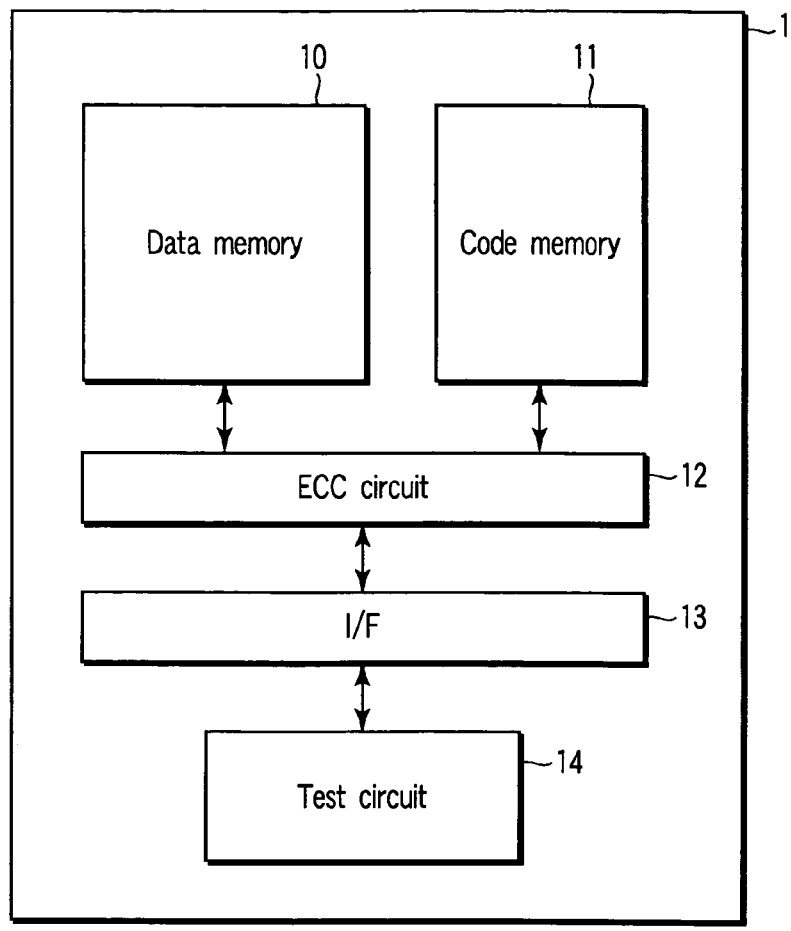
FIG. 1 is a block diagram showing essential parts of a semiconductor device according to an embodiment of the present invention.

FIG. 1 is a block diagram showing essential parts of a semiconductor device according to the present embodiment.

A semiconductor device 1 according to the present embodiment has a data memory 10 storing data and a code memory 11 storing code data (redundancy data) that is an error checking and correcting code (ECC code).

The data memory 10 and the code memory 11 may be, for example, DRAMs, SRAMs, flash memories, FeRAMs, or MRAMs. The semiconductor device 1 may be an LSI chip such as a microprocessor instead of the semiconductor storage device.

Moreover, the semiconductor device 1 contains an error checking and correcting circuit (ECC circuit) 12, an interface (I/F) 13, and a test circuit 14.

The ECC circuit 12 has logic that uses a Hamming matrix (or a Hamming code) having an error checking function to generate code data (code information (hereinafter sometimes referred to as an ECC code)) to be stored in the code memory 11.

The ECC circuit also includes logic that checks an error bit in data (a test pattern or an ECC code) read from the data memory 10 or code memory 11.

The test circuit 14 includes logic that generates a test pattern used to execute memory tests on the data memory 10. The test circuit 14 receives data from and outputs it to the ECC circuit 12 via the interface 13. The test circuit 14 is a built-in self-test (BIST) logic circuit which reads a test pattern written in the data memory 10 and which then executes memory tests.

Specifically, the test circuit 14 writes a test pattern in the data memory 10 via the ECC circuit 12 and the interface 12. The test circuit 14 then writes code data generated from this test pattern, in the code memory 11. Then, the test circuit 14 reads the test pattern written in the data memory 10, while reading the code data written in the code memory 11. Thus, the test circuit 14 compares the write data as expected values with the read data as memory outputs to detect defective bits in memory cells.

Method for Memory Tests

When using the test circuit 14, a BIST logic circuit, to execute memory tests on the data memory 10, the semiconductor device 1 according to the present embodiment simultaneously executes memory tests on the code memory 11.

To achieve this, the ECC circuit 12, upon writing a test pattern generated by the test circuit 14, in the data memory 10, generates code data corresponding to the test pattern. The ECC circuit 12 generates code data having an error checking function, from the test pattern, on the basis of generation logic that uses an appropriate Hamming matrix H (Hamming code) to generate code data (ECC code). The ECC circuit 12 outputs the code data to the code memory 11 (see FIGS. 2B and 2C).

Description will be given of the case in which code information (S) generated using the Hamming matrix (Hamming code) is used as code data. However, the code data may be generated using logic other than that for the Hamming code.

When the test circuit 14 executes memory tests on the data memory 10, the ECC circuit 12 checks error bits in the code data (ECC code) read from the code memory 11. The ECC circuit 12 then outputs the results of the check to the test circuit 14.

In short, when a test pattern is written in the data memory 10, the ECC circuit 12 generates code data corresponding to data constituting the test pattern and writes the code data in the code memory 11. Once the code data has been written into it by the use of the ECC circuit 12, the code memory 11 can be tested by the test circuit 14, in the same way the data memory 10 is tested.

Description will be given below of the specific contents of tests on the code memory 11.

(1) In the data memory 10, which stores data, and the code memory 11, which stores code data, background data is written to all the addresses in each of the memories 10 and 11. The background data may be, for example, iterative data such as (1010 . . . ) or (0101 . . . ) or identical data (1111 . . . ) or (0000 . . . ).

(2) Then, a test target address (first address) in each of the memories 10 and 11 is identified. Data is then read from the test target address. Then, the test target address in each of the memories 10 and 11 is tested by comparing the read data with the background data (expected value).

(3) Subsequently, for at least some of the data bits of the test target address in the data memory 10, the background data is inverted. The data obtained is then written to the test target address in the data memory 10 as a test pattern. At this time, code data generated by the ECC circuit 12 from this test pattern is written to the test target address in the code memory 11.

Then, the test target address in each of the memories 10 and 11 is tested by reading data from the test target address in each of the memories 10 and 11 and comparing the read data with the written data. Subsequently, the operations in (2) and (3) are repeated while changing the test target address.

In the above test operations, when a test pattern is input to test the data memory 10, all the bits in the code memory 11 change from 0 through 1 to 0 (or from 1 through 0 to 1). Thus, the test circuit 14 can execute checks on fixation defects based on 0/1 write (or read) tests and checks on partial data dependent defects that may occur during data changes.

The ECC circuit 12 executes error checks on the data memory 10 or the code memory 11. On the basis of the results of error checks output by the ECC circuit 12, the test circuit 14 determines reproducible error bits that occurred immediately after the write of the test pattern, to be initial defects.

In this case, with a Hamming matrix having an error checking function for N bits or more (N is a natural number equal to or greater than 2), when the test pattern is input, the data and the code data must be checked for all the patterns of arbitrary N-bit combinations.

Figure 2A:
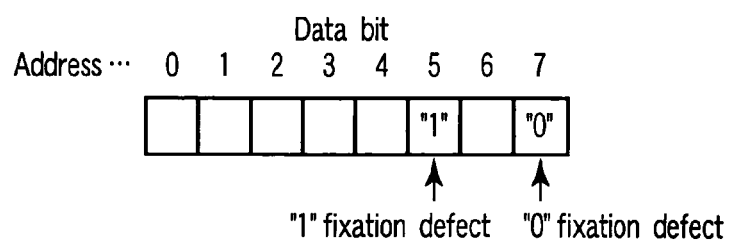
FIGS. 2A to 2C are diagrams showing a specific example of a test pattern according to the present embodiment.
Figure 2B:
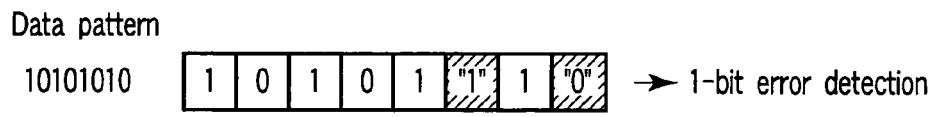
Figure 2C:
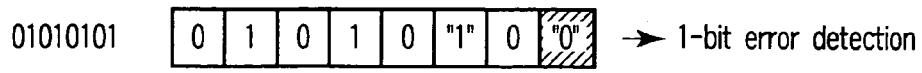

With reference to FIGS. 2A to 2C, description will be given of the case in which the Hamming matrix has an error checking function for 2 bits or more.

FIGS. 2A to 2C show a specific example of a test pattern according to the present embodiment. In the description of FIGS. 2A to 2C, for convenience, the data bits are composed of 8 bits by way of example, with the code bits omitted.

In this case, it is assumed that of the data bits, the bit at an address 5 has a "1" fixation defect, while the bit at an address 7 has a "0" fixation defect.

As shown in FIG. 2B, if the data pattern is (1010 . . . ), the "1" fixation defect at an address 5 can be detected, whereas the "0" fixation defect at an address 7 cannot be detected.

Furthermore, as shown in FIG. 2C, if the data pattern is (0101 . . . ), the "0" fixation defect at the address 7 can be detected, whereas the "1" fixation defect at the address 5 cannot be detected. On the other hand, if in the test pattern, the address 5 is "0" and the address 7 is "1", the fixation defect can be detected both at the address 5 and at the address 7.

Thus, if the Hamming matrix has an error checking function for 2 bits or more, when the test pattern is input, 1-bit defects can be distinguished from 2-bit defects by checking the data and the code data for all the patterns of arbitrary 2-bit combinations (00, 01, 10, 11). However, this does not apply to a single error correcting (SEC) system that is a 1-bit error correcting system.

Configuration of ECC Circuit 12

As previously described, upon writing a test pattern generated by the test circuit 14, in the data memory 10, the ECC circuit 12 generates code data corresponding to this test pattern. The ECC circuit 12 includes generation logic using an appropriate Hamming matrix H (Hamming code). The code data, having an error checking function, is written in the code memory 11.

Figures 3, 4, 5:
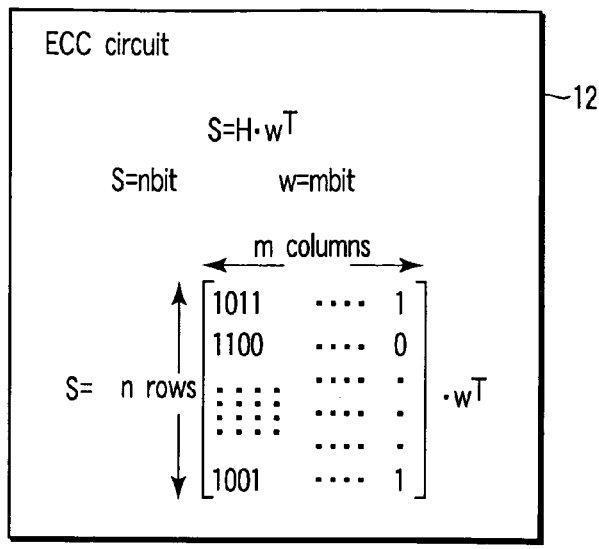
FIG. 3 is a diagram illustrating a scheme used by an ECC circuit according to the present embodiment.
FIG. 4 is a diagram showing a specific example of a Hamming matrix according to the present embodiment.
FIG. 5 is a diagram showing a test pattern used for memory tests according to the present embodiment.

FIG. 3 is a conceptual drawing showing the principle of the generation logic in the ECC circuit 12.

As shown in FIG. 3, the ECC circuit 12 uses the Hamming matrix H to generate code data S. Here, provided that the data bit width of data (test pattern) to be stored in the data memory 10 is equal to n bits and the bit width of code data stored in the code memory 10 is equal to m bits, the relationship between the data bit w and the code data S can be expressed as follows:

$$S = H * w^T \qquad (1)$$

S denotes a code bit (1×m) matrix and w denotes a data bit (1×n) matrix. The Hamming matrix H is an (n×m) matrix. T means a transposed matrix.

The matrix elements of the Hamming matrix H are composed of "1" or "0".

Here, as conditions for determining the Hamming matrix (Hamming code), for convenience, conditions 0 to 3 are defined.

The condition 0 corresponds to a single error correcting and double error detecting (Sec-Ded) code system having a 1-bit correcting function and a 2-bit detecting function.

To meet the condition 0, it is necessary that the sum of the matrix components of the Hamming matrix is odd. Here, it is assumed that a code bit matrix So is written in the code memory 11. It is also assumed that a code bit matrix S is obtained by reading the code bit matrix So from the code memory 11. Then, "S−So" is expressed as shown below in Equation (2).

w denotes a data bit matrix written in the data memory 10. wo denotes a data bit matrix read from the data memory 10.

$$S - So = H * w^T - H * wo^T = H * (w_T - wo^T) \qquad (2)$$

Equation (2) indicates that when the number of error bits is zero, the sum of the column components of "S−So" is zero. When the number of error bits is 1, the sum of the column components of the Hamming matrix H is odd. Accordingly, the sum of the column components of "S−So" is odd. Furthermore, when the number of error bits is 2, the sum of the column components of the Hamming matrix H is odd. The sum of the column components of "S−So" is the sum of the odd number and the odd number and is thus even. In this manner, the condition 0 means that the sum of the column components of the Hamming matrix is odd.

Next, the condition 1 means that the sum of the row components of the Hamming matrix is an odd number equal to or greater than 3.

Moreover, the condition 2 means that for a predetermined test pattern, all the cells of the data memory 10 and code memory 11 change from "0" to "1" and from "1" to "0".

The condition 3 means that for the same address in the data memory 10 and in the code memory 11, an arbitrary 2 bits contained in the data bit matrix w and bit matrix S cover all the patterns of 00, 01, 10, and 11.

Specific Example of Memory Test

Figure 6:
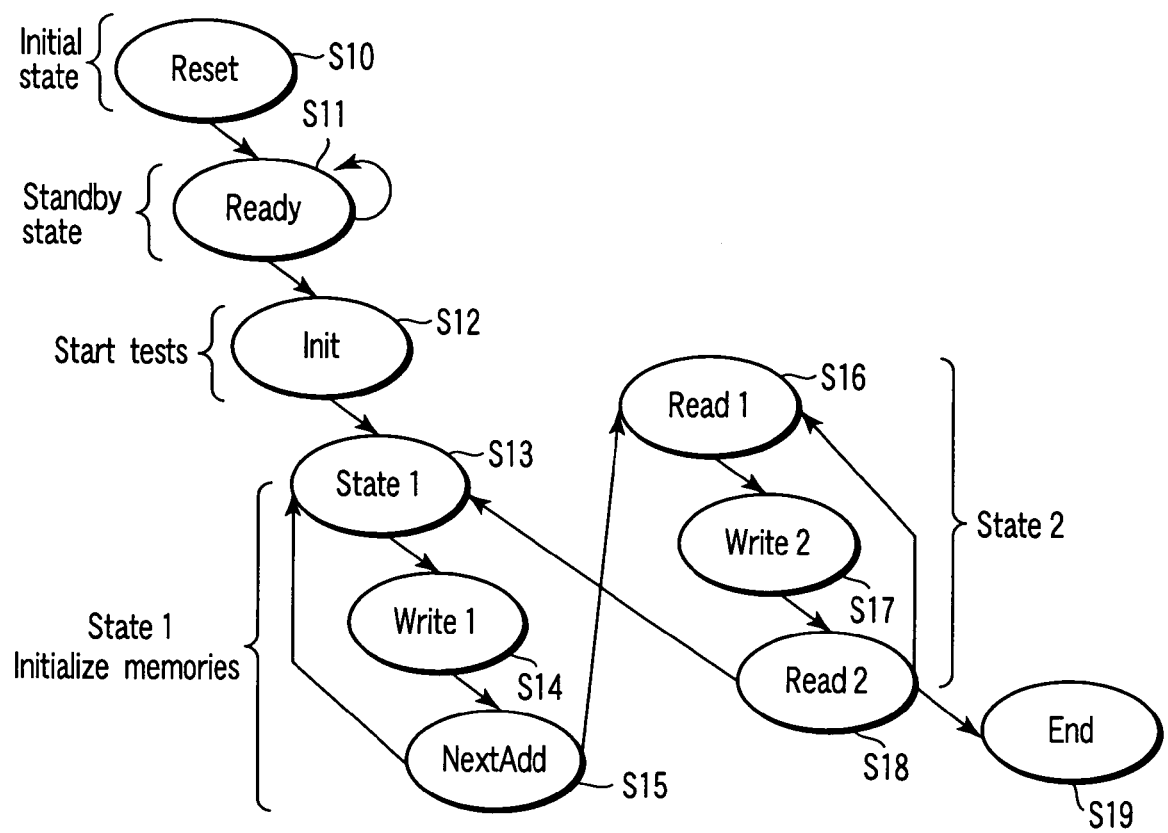
FIG. 6 is a diagram showing a part of the procedure of memory tests according to the present embodiment.

FIG. 4 shows a specific example of the Hamming matrix H according to the present embodiment. FIG. 5 shows a test pattern applicable to marching pattern tests which are simple and have a high error detection rate. FIG. 6 shows the procedure of a marching pattern test (marching operation).

In this specific example, it is assumed that the data w stored in the data memory 10 has a bit width of 8 bits. It is also assumed that the bit width for inputs and outputs (I/O) is 2 bits.

The Hamming matrix H, used by the ECC circuit 12, is composed of an (n×m=8×5) matrix as shown in FIG. 4. That is, the code data stored in the code memory 11 has a bit width of 5 bits. Accordingly, the data bit w is expressed as a (1×8) matrix. The code bit S is expressed as a (1×5) matrix.

Now, with reference to FIGS. 5 and 6, description will be given of marching pattern tests applied as specific memory tests.

The marching pattern tests use different test patterns to executes a plurality of writes and reads on a particular address in the memory. Then, a plurality of writes and reads are sequentially executed on the particular addresses while changing the address. The series of operations of repeating tests while changing the address are referred to as marching operations.

In this specific example, description will be given of the case in which a memory of "8 bits×internal address n" is accessed as a "2 bits×external address 4n". FIG. 5 shows, as test patterns, specific examples of the data input pattern w, input to the data memory 10, and the code output pattern S, written in the code memory 11.

FIG. 5 shows variations in data for the test patterns, which variations are observed when attention is paid to one particular address (internal address 1) in the memory.

As shown in FIG. 6, the test circuit 14 starts tests (marching operations) after an initial state (step S10) and a standby state (step S11).

First, the test circuit 14 initializes the memories in a state 1 (steps S13 to S15). Specifically, 0 is written to all the addresses in each of the data memory 10 and code memory 11.

Then, the test circuit performs marching operations using external addresses. In this case, 2 bits of each of the external addresses are sequentially changed to "11" starting with the address 1. Then, if attention is paid to the address 1 of the internal addresses, every lower 2 bits of the 8 bits are sequentially changed to "11". Accordingly, in the state 1, to initialize the memories, "00" is written to all the addresses in the data memory 10 and code memory 11.

Then, the test circuit 14 performs an operation of reading "00" from one address (expressed as an external address) in the memory (step S16). Then, the test circuit 14 performs an operation of writing "11" to this address (step S17). Moreover, the test circuit 14 performs an operation of reading "11" from this address.

The series of operations (marching operations) for the test pattern "11" are performed on all the addresses in the memory. Also for the test pattern "01", the marching operations are performed on all the addresses in the memory.

Specifically, the data input pattern w is read from the data memory 10, while the corresponding code output pattern S is written to the code memory 11. The code output pattern S, read from the code memory 11, is checked.

In this case, for the condition 1 for the series of marching operations, the test circuit 14 checks whether or not the code output pattern S is full of "0"s (ALL 0) if the data input pattern w is full of "0"s (see FIG. 5). This enables checks on fixation defects during 0/1 writes (or reads).

Moreover, for the condition 2 for the marching operations, the test circuit 14 checks whether or not all the bits in the code memory 11 change from "0" to "1" or "1" to "0" in accordance with the data input pattern w. This enables checks on data change defects.

Then, for the condition 3 for the marching operations, the test circuit checks whether or not arbitrary 2-bit combinations in the same address in the data memory 10 and code memory 11 cover all the patterns of 00, 01, 01, and 11 (see arrows 50 and 51 in FIG. 5). This enables checks on 2-bit defects using the ECC code.

Finally, for the condition for the marching operations, the test circuit 14 checks whether or not the data input pattern w is (011 . . . 1) and the code output pattern S is full of "1"s (ALL 1) if the matrix (n, m) of the Hamming matrix H is a combination or (odd number, even number) or (even number, odd number) (see FIG. 5).

The memory tests are finished by completing the series of marching operations under the conditions 1 to 4 as described above (step S19).

Here, the marching operations are test operations relating to the condition 4 for convenience, compared to the conditions 0 to 3, previously defined as Hamming code determining conditions.

The condition 4 specifies that the matrix is configured so that the sum of the row components of the Hamming matrix except for one specified bit is odd. Thus, when the data bit w=(00 . . . 0) or (011 . . . 1), the code bit S=(00 . . . 0) or (11 . . . 1).

With the Hamming matrix H, if the matrix (n, m) is a combination of (odd number, even number) or (even number, odd number), it is mathematically impossible to simultaneously meet the previously described conditions 0 and 1. Thus, a Hamming code is created such that when only 1 bit of the data bits w (11 . . . 1), input as a test pattern, is set to "0" (example: 011 . . . 1), the code bits S, stored in the code memory 11, are (11 . . . 1). It is thus possible to set the code bits S at (00 . . . 0) or (11 . . . 1) while meeting the condition 0.

In the description of FIG. 5, only the most significant bit of the data bits w, input as a test pattern, is set to "0". The bit set to "0" before input is not limited to the most significant bit. However, the most significant bit of the data bits w is expected to undergo data changes less frequently than the other bits. Accordingly, to make the semiconductor device reliable, it is desirable to set the most significant bit to "0" before input.

As described above, with the semiconductor device 1 containing the ECC circuit 12 and test circuit 14 according to the present embodiment, the ECC circuit 12 uses an appropriate Hamming matrix to generate a Hamming code that meets the conditions 0 to 3 (or the conditions 0 to 4). The ECC circuit 12 then stores the Hamming code in the code memory 11 as code data. Then, in a test sequence (BIST) that uses the data bit matrix w a test pattern to test the data memory, the code memory 11 can be simultaneously tested on the basis of the code data read from the code memory 11.

Consequently, the time required for tests can be reduced compared to tests on the data memory 10 and code memory 11 using separate test sequences. It is further possible to integrate test circuits that test the data memory 10 and the code memory 11, respectively, into a single test circuit. As a result, the costs of memory tests can be reduced.

In the above embodiment, the test circuit 14 is formed on a chip in which the data memory 10 and code memory 11 to be tested are arranged. However, the test circuit 14 may be formed on a chip different from the one in which the data memory 10 and code memory 11 to be tested are arranged. Alternatively, the test circuit 14 may be omitted and an external tester may be used to test the data memory 10 and the code memory 11.

Moreover, in the above embodiment, the ECC circuit 12 is formed in a chip in which the data memory 10 and code memory 11 are arranged. However, the ECC circuit 12 may be formed in a chip different from the one in which the data memory 10 and code memory 11 are arranged. For example, the pair of the data and code memories 10 and 11 and the ECC circuit 12 may be formed on different chips and these chips may be arranged on a printed circuit board (PCB).

Moreover, in the example shown in the above embodiment, the marching pattern tests are applied as memory tests. However, the memory tests are not limited to the marching pattern tests.

As described above, according to the present embodiment, in a semiconductor device which contains an ECC circuit and in which both data memory and code memory are mounted, the data memory and the code memory can be simultaneously tested. This makes it possible to reduce the time required for memory tests and the number of test circuits required. As a result, the cost of the memory tests can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a data memory which stores data;
   a code memory which stores an ECC code for a test corresponding to the data;
   an ECC circuit which supplies the data memory with a test pattern for detecting a bit error for all cells of the data memory, generates code data as the ECC code from the test pattern using a Hamming matrix which meets predetermined conditions, and supplies the code memory with the code data, the ECC circuit generating the code data for detecting a bit error for all cells of the code memory using a transposed matrix of the test pattern and the Hamming matrix; and
   a test circuit which simultaneously tests the data memory and the code memory based on the test pattern written in the data memory and the code data generated by the ECC circuit.

2. The semiconductor device according to claim 1, wherein the ECC circuit generates the code data using the Hamming matrix configured so that a sum of row components of the matrix is odd as the predetermined conditions.

3. The semiconductor device according to claim 1, wherein the ECC circuit generates the code data using the Hamming matrix configured so that all bits of the code data change from "0" to "1" or from "1" to "0" in accordance with an inputting of the test pattern as the predetermined conditions.

4. The semiconductor device according to claim 1, wherein the ECC circuit generates the code data using the Hamming matrix configured so that arbitrary N (N is a natural number equal to or greater than 2) bits of the same address cover all patterns of N-bit combination in accordance with the inputting of the test pattern as the predetermined conditions.

5. The semiconductor device according to claim 1, wherein the ECC circuit generates the code data using the Hamming matrix configured so that when all bits of the test pattern other than one specified bit are "1"s, all the bits of the code data generated from the test pattern are "1"s as the predetermined conditions.

6. A method of memory test which is applied to a semiconductor device including a data memory which stores data and a code memory which stores an ECC code for a test corresponding to the data, the method comprising the steps of:
   generating a test pattern required to execute a test for detecting a bit error for all cells of the data memory;
   outputting the test pattern to the data memory;
   generating code data as the ECC code for detecting a bit error for all cells of the code memory using a Hamming matrix which meets predetermined conditions and a transposed matrix of the test pattern and the Hamming matrix; and
   simultaneously testing the data memory and the code memory based on the test pattern written in the data memory and the code data generated.

7. The method according to claim 6, wherein the step of generating the code data includes generating the code data using the Hamming matrix configured so that a sum of row components of the matrix is odd as the predetermined conditions.

8. The method according to claim 6, wherein the step of generating the code data includes generating the code data using the Hamming matrix configured so that all bits of the code data change from "0" to "1" or from "1" to "0" in accordance with an inputting of the test pattern as the predetermined conditions.

9. The method according to claim 6, wherein the step of generating the code data includes generating the code data using the Hamming matrix configured so that arbitrary N (N is a natural number equal to or greater than 2) bits of the same address cover all patterns of N-bit combination in accordance with the inputting of the test pattern as the predetermined conditions.

10. The method according to claim 6, wherein the step of generating the code data includes generating the code data using the Hamming matrix configured so that when all bits of the test pattern other than one specified bit are "1"s, all the bits of the code data generated from the test pattern are "1"s as the predetermined conditions.

* * * * *